United States Patent [19]

Jacquart

[11] 4,315,307
[45] Feb. 9, 1982

[54] SWITCHING DEVICE AND SWITCHED-TYPE POWER SUPPLY USING THE SAME

[75] Inventor: Christian Jacquart, Gattieres, France

[73] Assignee: International Business Machines Corp., Armonk, N.Y.

[21] Appl. No.: 155,288

[22] Filed: Jun. 2, 1980

[30] Foreign Application Priority Data

Jun. 12, 1979 [FR] France .............................. 79 15736

[51] Int. Cl.³ .......................................... H02M 7/537
[52] U.S. Cl. ..................................... 363/134; 357/43; 307/584
[58] Field of Search ................................. 363/24–26, 363/133, 134; 307/250, 251, 304; 357/43, 46

[56] References Cited

U.S. PATENT DOCUMENTS

| 3,408,544 | 10/1968 | Teszner | 357/43 X |
| 3,490,027 | 1/1970 | Galetto et al. | 363/24 |
| 3,708,699 | 1/1973 | Frei et al. | 307/251 X |
| 3,740,581 | 6/1973 | Pfiffner | 307/251 |
| 4,095,252 | 6/1978 | Ochi | 357/43 |

Primary Examiner—William M. Shoop
Assistant Examiner—Peter S. Wong
Attorney, Agent, or Firm—W. S. Robertson

[57] ABSTRACT

Signals to the base of a bipolar transistor and to the gate of a parallel - connected FET are timed to turn on the two transistors simultaneously and to turn off the bipolar transistor before the FET. The shorter switching time of the FET is combined with the low resistance of the bipolar transistor to provide a switch that is particularly useful in a switched-type power supply with increased switched frequency.

3 Claims, 3 Drawing Figures

FIG. 1
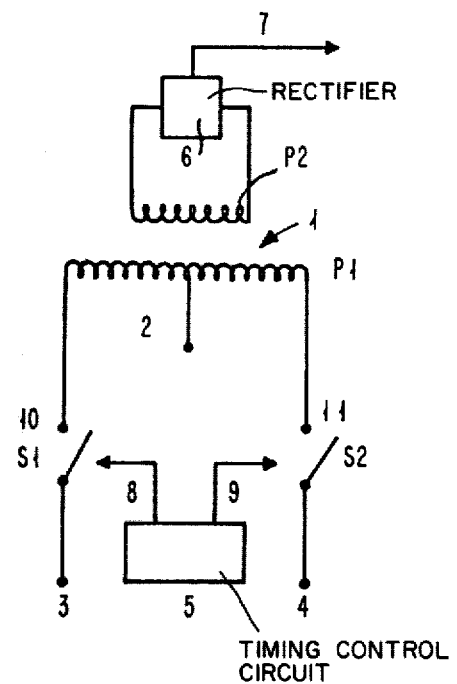
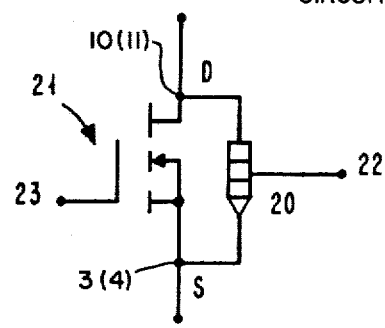
FIG. 2

4,315,307

SWITCHING DEVICE AND SWITCHED-TYPE POWER SUPPLY USING THE SAME

DESCRIPTION

1. Technical Field

This invention relates to an improved switching device that exhibits reduced switching times and a very low resistance in the ON state and is particularly suitable for use in switched-type power supplies.

Switching devices are widely used in electronic circuits. These devices are caused, usually by means of control signals, to switch between an ON (or closed) state, in which current flows through the device, and an OFF (or open) state, in which current flow is inhibited.

2. Background Art

In most applications, these switching devices consist of simple bipolar transistors which, under the control of pulses applied to their bases, switch between their ON (conductive) and OFF (non-conductive) states. Although they satisfactorily meet the requirements of many applications, these devices have a number of drawbacks which render them inefficient in applications wherein very short and very accurate switching times are called for, for example, in switched-type power supplies. Today, efforts are being made to reduce the size of the transformers used in such power supplies. This reduction in size can be achieved by increasing the switching frequency, which necessitates nearly perfect switches.

DISCLOSURE OF INVENTION

It is, therefore, an object of this invention to provide a highly efficient switching device, that is, a switching device that exhibits short switching times and a very low resistance in the ON state.

It is another object of this invention to provide such a device that can readily be implemented in integrated circuit form.

The device of the present invention comprises, in combination, a bipolar transistor and a field effect transistor (FET), preferably of the VMOS type. The two devices are connected in parallel, that is, the collector and the emitter of the bipolar transistor are respectively connected to the drain and to the source of the FET. The operation of the switching device is controlled by signals applied to the base of the bipolar transistor and to the gate of the FET. These signals have the same frequency and are such that they will cause the two transistors to turn ON simultaneously and the bipolar transistor to turn OFF before the FET.

This arrangement makes it possible to combine the respective advantages of the two devices. A FET has shorter switching times than a bipolar transistor, but its resistance in the ON state is relatively high, so that it would not constitute a perfect switching device if used alone. The low resistance exhibited by a bipolar transistor in its ON state offsets this disadvantage.

The present switching device is, therefore, particularly advantageous when used in a switched-type power supply since it enables the switching frequency to be significantly increased.

The foregoing and other objects, features and advantages of the invention will be apparent from the following more particular description of a preferred embodiment of the invention, as illustrated in the accompanying drawings.

BRIEF DESCRIPTION OF DRAWINGS

FIG. 1 is a schematic view of a switched-type power supply into which the present invention can be incorporated.

FIG. 2 shows a switching device in accordance with the invention.

PREFERRED EMBODIMENT OF INVENTION

Figure 3:
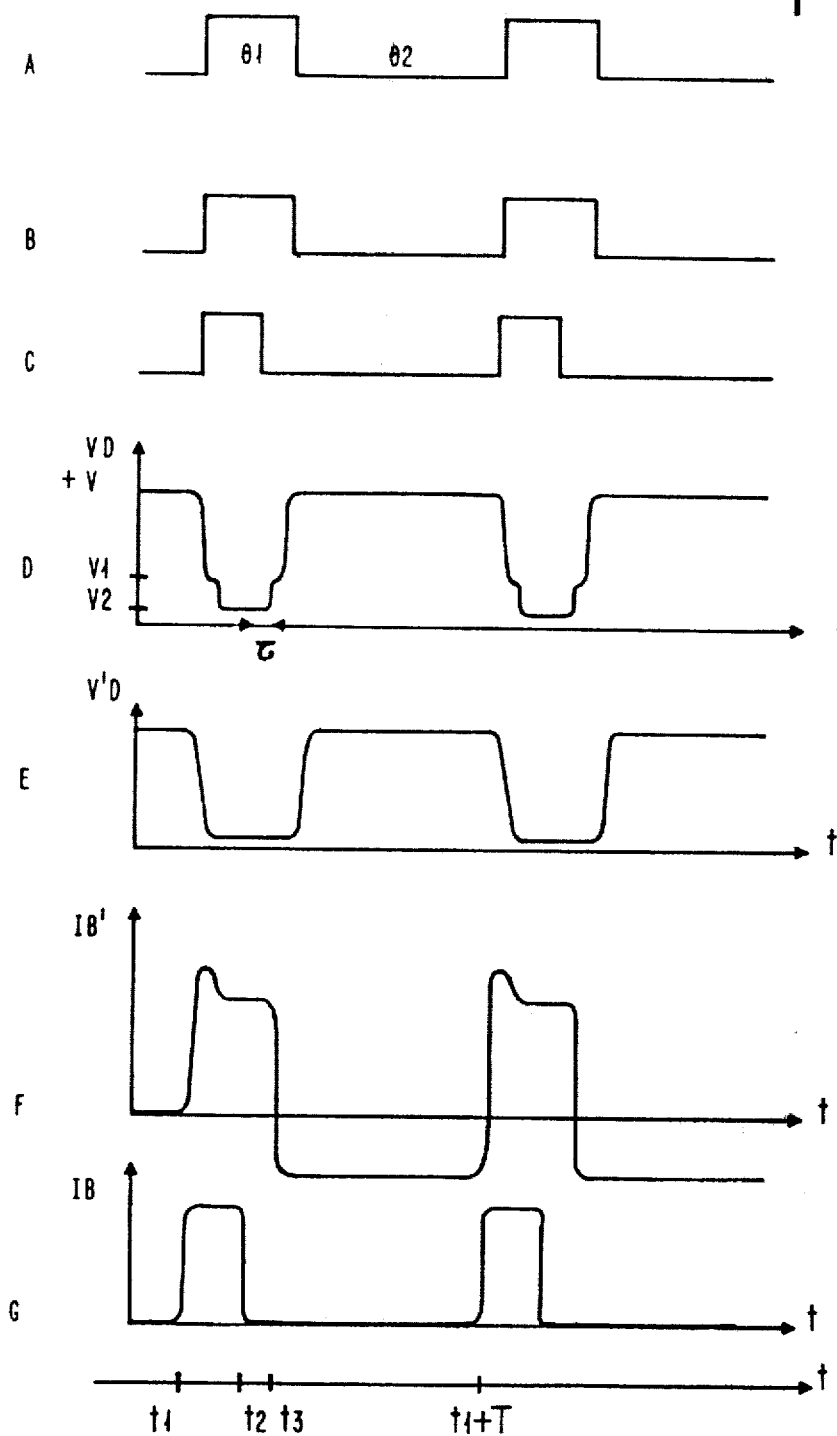
FIG. 3 is a timing diagram illustrating the signals used in the device of FIG. 2.

Referring to FIG. 1, the principles of operation of a switched-type power supply into which the switching device of the present invention can be incorporated will now be described. Such an application is mentioned by way of example only, it being understood that the switching device could be used in other circuits.

Generally, a switched-type power supply includes a transformer 1 whose primary winding P1 is provided with a center tap 2 connected to a DC source such as +V. The terminals 10 and 11 at the opposite ends of the winding P1 are connected via two switches S1 and S2 to terminals 3 and 4. Where the terminal 2 is connected to a positive voltage +V, the terminals 3 and 4 are connected to ground. The switches S1 and S2 are alternatively caused to turn ON by control signals supplied by a circuit 5, so that current will flow alternatively between terminals 2 and 3 and between terminals 2 and 4. The secondary circuit, comprising the secondary winding P2 and a rectifier 6 connected to the terminals of P2, provides a DC voltage at its output 7. The value of this voltage is dependent upon the number of turns in the primary and secondary windings.

The circuit 5 provides at its outputs 8 and 9 control signals that are 180° apart in phase and do not overlap, to alternatively operate the switches S1 and S2.

The switching device of the present invention will now be described with reference to FIG. 2. This device includes a bipolar transistor 20 which, in this example, is of the NPN-type, and a FET 21 which, in a preferred embodiment, is of the VMOS-type. The emitter and the collector of the transistor 20 are respectively connected to the source and to the drain of the FET 21. The pulses that control the state of the switching device are respectively applied to the base of the transistor 20 and to the gate of the FET 21 through the terminals 22 and 23, respectively.

Referring next to FIG. 3, the control pulses applied to the terminals 22 and 23 are shown. Signal A represents the theoretical time intervals $\theta 1$ and $\theta 2$ during which the switching device is to remain ON and OFF, respectively.

Signal B represents the control voltage applied to the gate of the VMOS transistor. Signal C represents the control voltage applied to the base of the bipolar transistor. Signal D represents the voltage VD at point D which is common to the collector and to the drain of transistors 20 and 21.

Signal E illustrates the voltage V'D that would be obtained at the collector of a bipolar transistor used alone as switch S1 or S2 and controlled by a signal such as A. Signal F represents the current IB' that should be applied to the base of this transistor.

Signal G represents the current IB to be applied to the base of the transistor 20 of FIG. 2.

The operation of the switching device of the present invention will now be described with reference to FIGS. 2 and 3.

At time t1, when signals B and C go up, the transistors 20 and 21 turn ON and therefore, if this device is used in the arrangement shown in FIG. 1, the voltage at point D, which was +V, begins to drop fairly rapidly because of the high switching speed of the transistor 21, and continues to drop until a value V1, which is equal to the saturation voltage of the transistor 21, is reached. VD remains at this value until the transistor 20 becomes saturated, at which time it drops to a value V2, which is equal to the saturation voltage for the transistor 20 and very close to zero. At time t2, signal C causes the bipolar transistor 20 to go OFF after a time interval τ representing the time necessary for the charges stored in this transistor to be transferred. As a result, the voltage VD returns to the level V1 and remains there till time t3, when signal B causes the VMOS transistor 21 to go OFF, at which time VD returns to the level +V.

As shown in FIG. 3, there are practically no switching losses and, consequently, the frequency of pulses A can be high. Frequencies up to 500 kHz may be envisaged, compared to 20 to 50 kHz in prior art devices.

Accordingly, when the present switching device is used in a power supply of the type shown in FIG. 1, the size of the transformer can be reduced.

Also, since there are practically no switching losses, the bipolar transistor 20 need not be provided with a heat sink and would therefore be less bulky.

Signal E, which represents the voltage V'D that would be obtained if the switch solely consisted of a bipolar transistor controlled by pulses A (the FET 21 being omitted), clearly shows the switching losses that would then be experienced. In this instance, a base current such as that illustrated by the curve F, with a peak at time t1, would be required to cause the transistor to turn ON more quickly. This current would then have to be maintained at a lower value to cause the transistor to remain saturated, and at time t3 a negative current would be needed to eliminate the stored charges and cause the transistor to turn OFF. Thus, control of the switch would be a complicated matter. In the present invention, however, since the switching of the transistor 20 as used in the device of FIG. 2 is not critical, a simple current pulse of the form illustrated by curve G, that is, positive between t1 and t2, is all that will be required. A bipolar transistor exhibiting a lower breakdown voltage can be used because when such a transistor is caused to turn OFF the voltage thereacross is low since the transistor 21 is still ON.

This arrangement, when used as switch S1 or S2 in a power supply of the type shown in FIG. 1, may be implemented as follows. For example, in regard to the switch S1, point S, which is common to the source of the transistor 21 and to the emitter of the transistor 20, should be connected to the terminal 3 and point D to the terminal 10. Similarly, in the case of the switch S2, point S should be connected to the terminal 4 and point D to the terminal 11. The circuit 5 should apply control pulses to the terminals 22 and 23 of each switch; the control pulses applied to either one of the switches would be of the type illustrated in FIG. 3 while those applied to the other switch would be identical to those of FIG. 3 but delayed in phase by 180°.

While the invention has been particularly shown and described with reference to a preferred embodiment thereof, it will be understood by those skilled in the art that numerous changes in form and detail may be made therein without departing from the spirit and scope of the invention.

Having thus described my invention, what I claim as new, and desire to secure by Letters Patent is:

1. A switching device having an ON (closed) position and an OFF (open) position and controlled by control signals, comprising, a bipolar transistor and timing means connected to the base of the bipolar transistor to apply a first control signal at a first level to cause said transistor to turn ON and at a second level to cause said transistor to turn OFF, a field effect transistor; means connecting the collector and the emitter of said bipolar transistor to the drain and to the source of said field effect transistor; and means connected to the gate of the field effect transistor to apply a second control signal that has the same frequency as the first, said second control signal being applied at a third level for causing said field effect transistor to turn ON and at a fourth level for causing said field effect transistor to turn OFF, the time interval during which said second control signal is at said third level being longer than the time interval during which said first control signal is at said first level.

2. The switching device of claim 1 wherein said means connected to apply said first and second control signals includes means for substantially simultaneously turning ON said bipolar transistor and said field effect transistor and for turning OFF said bipolar transistor sufficiently ahead of turning OFF said field effect transistor to compensate for the turnoff delay of the bipolar transistor that is associated with saturation.

3. An alternating voltage power supply comprising an inductive winding having a center tap and a direct voltage source having a first terminal connected to said center tap and including first and second switch devices as defined in claim 2; said devices being connected to conduct between opposite ends of the winding and a second terminal of said voltage source, and means connecting said base and gate terminals to said control signal means in a phase to operate the first and second switch alternatively.

* * * * *